United States Patent
Göötz et al.

(10) Patent No.: US 11,552,221 B2
(45) Date of Patent: Jan. 10, 2023

(54) OPTOELECTRONIC COMPONENT AND METHOD FOR MANUFACTURING AN OPTOELECTRONIC COMPONENT

(71) Applicant: OSRAM Opto Semiconductors GmbH, Regensburg (DE)

(72) Inventors: Britta Göötz, Regensburg (DE); Hubert Halbritter, Dietfurt (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 301 days.

(21) Appl. No.: 16/498,763

(22) PCT Filed: Apr. 19, 2018

(86) PCT No.: PCT/EP2018/060004
§ 371 (c)(1),
(2) Date: Jun. 12, 2020

(87) PCT Pub. No.: WO2018/193026
PCT Pub. Date: Oct. 25, 2018

(65) Prior Publication Data
US 2020/0303600 A1  Sep. 24, 2020

(30) Foreign Application Priority Data
Apr. 21, 2017  (DE) .................. 102017108573.4

(51) Int. Cl.
*H01L 33/50* (2010.01)
*H01L 33/00* (2010.01)
(Continued)

(52) U.S. Cl.
CPC .......... *H01L 33/502* (2013.01); *H01L 33/005* (2013.01); *H01L 33/505* (2013.01); *H01L 33/60* (2013.01); *H01S 5/0087* (2021.01)

(58) Field of Classification Search
CPC ... H01L 33/005; H01L 33/502; H01L 33/505; H01L 33/507; H01L 33/60; H01S 5/0087; H01S 5/423
See application file for complete search history.

(56) References Cited

U.S. PATENT DOCUMENTS 10,139,055 B2    11/2018  Inoue et al.
2003/0006382 A1*  1/2003  Spath ................... H01L 27/156
                                                             250/495.1
(Continued)

FOREIGN PATENT DOCUMENTS

CN      102361057 B    6/2014
DE    102014205294 A1   9/2015
(Continued)

OTHER PUBLICATIONS

Rosemann et al. ("A highly efficient directional molecular white-light emitter driven by a continuous-wave laser diode" Science vol. 352, Issue 6291 pp. 1301-1304; Published Jun. 10, 2016 (Year: 2016).*

(Continued)

Primary Examiner — Matthew C Landau
Assistant Examiner — Dmitriy Yemelyanov
(74) Attorney, Agent, or Firm — Slater Matsil, LLP

(57) ABSTRACT

An optoelectronic component and a method for manufacturing an optoelectronic component are disclosed. In an embodiment an optoelectronic component includes a diffractive optical element comprising at least one conversion material and a light source configured to emit primary radiation, wherein the conversion material is encapsulated in the diffractive optical element, and wherein the conversion material is arranged in a beam path of the primary radiation and is configured to convert the primary radiation at least partially into secondary radiation.

14 Claims, 3 Drawing Sheets

(51) Int. Cl.
*H01L 33/60* (2010.01)
*H01S 5/00* (2006.01)

(56) References Cited

U.S. PATENT DOCUMENTS

| | | | |
|---|---|---|---|
| 2004/0150991 A1 | 8/2004 | Ouderkirk et al. | |
| 2007/0047232 A1* | 3/2007 | Kim | G02B 19/0071 362/305 |
| 2011/0090696 A1* | 4/2011 | Nagai | H01L 33/505 362/293 |
| 2012/0224378 A1* | 9/2012 | Koike | C09K 11/7774 362/259 |
| 2014/0021503 A1* | 1/2014 | Yoshida | H01L 33/641 257/98 |
| 2014/0242343 A1* | 8/2014 | Free | B32B 7/06 428/164 |
| 2015/0261076 A1* | 9/2015 | Dijken | G02B 26/008 359/326 |
| 2016/0178915 A1* | 6/2016 | Mor | G06F 3/042 359/573 |
| 2017/0025585 A1 | 1/2017 | Fan | |
| 2017/0040509 A1* | 2/2017 | Kadomi | H01L 33/50 |
| 2017/0227176 A1* | 8/2017 | Inoue | F21K 9/64 |

FOREIGN PATENT DOCUMENTS

| | | | |
|---|---|---|---|
| JP | 2012009696 A | * | 1/2012 |
| WO | 2005100016 A2 | | 10/2005 |
| WO | 2016017457 A1 | | 2/2016 |

OTHER PUBLICATIONS

Rosemann, N. W. et al., "A Highly Efficient Directional Molecular White-Light Emitter Driven by a Continuous-Wave Laser Diode," Optical Materials, Science, vol. 352, Issue 6291, Jun. 10, 2016, 4 pages.

Rosemann, N.W. et al., "Supplementary Materials for a Highly Efficient Directional Molecular White-Light Emitter Driven by a Continuous-Wave Laser Diode," Science AAAS, vol. 352, No. 6291, Jun. 10, 2006, 22 pages.

* cited by examiner

FIG 7
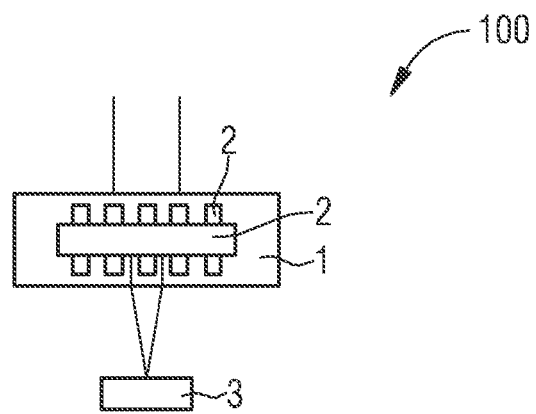
FIG 8
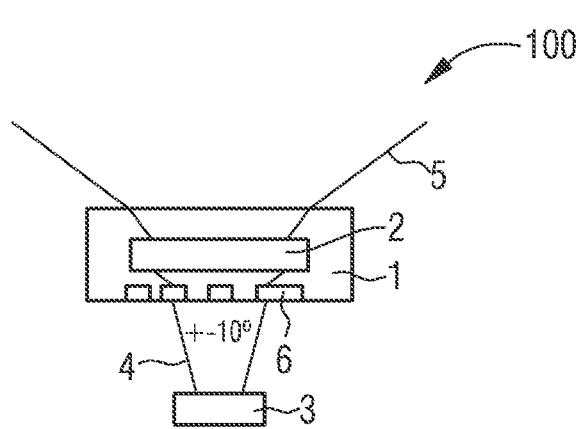

FIG 9F

OPTOELECTRONIC COMPONENT AND METHOD FOR MANUFACTURING AN OPTOELECTRONIC COMPONENT

This patent application is a national phase filing under section 371 of PCT/EP2018/060004, filed Apr. 19, 2018, which claims the priority of German patent application 102017108573.4, filed Apr. 21, 2017, each of which is incorporated herein by reference in its entirety.

TECHNICAL FIELD

The invention relates to an optoelectronic component. Furthermore, the invention relates to a method for manufacturing an optoelectronic component.

BACKGROUND

So far, optoelectronic components with a desired radiation characteristic are provided, which include conventional converters with Lambert radiation. The secondary radiation converted by the converters can then be deflected by means of complex optics and/or reflectors to produce a desired radiation characteristic. Alternatively, directionally receiving converter materials can be encapsulated separately from the optics. This makes it easier to generate the components if necessary. However, additional process steps are necessary, which can lead to a larger geometry.

SUMMARY OF THE INVENTION

Embodiments provide an optoelectronic component with a desired radiation characteristic. Further embodiments provide a method for manufacturing an optoelectronic component that produces an optoelectronic component with a desired radiation characteristic.

Often, customers or end users can only use a narrower range around the sample standards, this means for example, +/−30° or +/−60° to +/−70° as radiation characteristics.

In at least one embodiment, the optoelectronic component comprises a diffractive optical element. The diffractive optical element comprises at least one conversion material. The component comprises a light source. The light source is configured to emit primary radiation. The conversion material is encapsulated in the diffractive optical element. In particular, the conversion material is hermetically encapsulated in the diffractive optical element against environmental influences such as moisture and/or acid gases. The conversion material is arranged in the beam path of the primary radiation. The conversion material is configured to convert the primary radiation at least partially or completely into secondary radiation. In particular, the secondary radiation comprises at least one peak wavelength maximum at larger wavelengths compared to the peak wavelength maximum of the primary radiation.

According to at least one embodiment, the component comprises a diffractive optical element. Diffractive optical elements (abbreviated DOE) are optical elements for forming a light beam. The light beam is in particular part of a light source, in particular of a laser light source. The physical principle of the DOE is diffraction at an optical grating. Diffractive optical elements can comprise at least one glass carrier or two glass carriers on which microstructures can be arranged.

The microstructures can be applied by photolithography. In the diffractive optical element, phase modulation can occur due to different optical path lengths of the partial beams, resulting in interference patterns. In addition, the amplitude can be modulated by constructive and destructive superposition. This can be used to change the intensity patterns in a light source, such as a laser beam.

Diffractive optical elements can either form the primary and/or secondary radiation or they can split the radiation, for example, the primary radiation, into several partial beams. DOEs are sufficiently well known to a person skilled in the art and are therefore not explained here in detail.

According to at least one embodiment, the diffractive optical element comprises a conversion material. The conversion material is configured to convert the primary radiation emitted by a light source at least partially into secondary radiation. This can also be called partial conversion. In other words, all radiation emitted from the component is composed of primary and secondary radiation.

Alternatively, the conversion material can also be configured to convert the primary radiation completely into secondary radiation. This can also be called full conversion. The total radiation emitted from the component is then the secondary radiation.

According to at least one embodiment, the conversion material is an adamantane-like cluster molecule.

According to at least one embodiment, the cluster molecule comprises tin.

According to at least one embodiment, the cluster molecule comprises tin and/or sulphur.

According to at least one embodiment, the conversion material comprises or consists of $[((4\text{-}(CH_2\!=\!CH)\text{---}C_6H_4)Sn)_4S_6]$.

The conversion material may have the following structure:

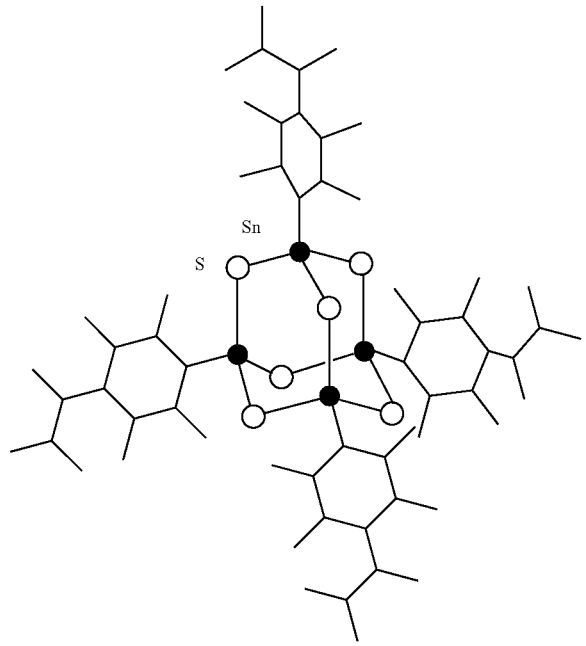

In particular, the conversion material comprises a diamond-like cluster structure. In particular, the conversion material is tin-sulphur-based with an adamantane-like $[Sn_4S_6]$ backbone. The lattice is free of an inversion symmetry because it comprises a tetrahedral form.

Alternatively, other suitable materials can in principle also be used. In the conversion material, oscillations can preferably be excited, in particular molecular oscillations, i.e., atoms move relative to each other, which can be excited, for example, in the IR. In particular, the conversion material can be applied disorderly. Systems that arrange themselves easily symmetrically are therefore generally badly suited as conversion material. In particular, the electron should not enter the first excited state, otherwise it will easily degrade. The highest energy in the spectrum is in particular lower than the energy distance mentioned above.

According to at least one embodiment, the optoelectronic component comprises a light source. The light source is configured to emit primary radiation. The light source therefore emits primary radiation during operation of the component. In particular, the light source is a laser.

In particular, the light source is a VCSEL array (vertical-cavity surface-emitting laser), which has a primary beam with a wavelength from the IR range.

Preferably, the wavelength of the primary radiation has a value between including 920 nm and including 950 nm, for example, 940 nm.

According to at least one embodiment, the light source has a semiconductor layer sequence. The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, where $0 \leq n \leq 1$, $0 \leq m \leq 1$ and $n+m \leq 1$ respectively. The semiconductor layer sequence may contain dopants as well as additional components. For the sake of simplicity, however, only the essential components of the crystal lattice of the semiconductor layer sequence, i.e., Al, As, Ga, In, N or P, are indicated, even if these may be partially replaced and/or supplemented by small quantities of other substances.

According to at least one embodiment, the optoelectronic component is a light-emitting diode, LED for short.

According to at least one embodiment, the radiation angle of the primary radiation is between less than or equal to +−30°, i.e., between −30° and +30°, or less than or equal to +−40° or +−50° or +−60° or +−70°. Alternately or additionally, the radiation angle of the secondary radiation is equal to or greater than or smaller than the radiation angle of the primary radiation.

According to at least one embodiment, the radiation angle of the primary radiation is between less than or equal to +−5°, +−10°, +−15°, +−20° or +−25°.

According to at least one embodiment, the radiation angle of the primary radiation is between <+−30° and the radiation angle of the secondary radiation is >=the radiation angle of the primary radiation.

According to at least one embodiment, the diffractive element comprises at least one carrier and microstructures. In particular, the microstructures are arranged between the conversion material and the light source. Alternatively, the microstructures are arranged on the side of the diffractive optical element opposite to the light source.

According to at least one embodiment, the conversion material is formed as a conversion layer. The conversion layer preferably has a layer thickness between 500 nm and 500 μm. The conversion layer is especially arranged within the diffractive optical element.

According to at least one embodiment, the microstructures are arranged on the side of the conversion layer opposite to the light source, in particular directly, i.e., in direct mechanical contact.

Alternatively or additionally, the microstructures are arranged on the side of the conversion layer facing the light source, in particular directly.

According to at least one embodiment, the microstructures comprise recesses. The recesses are filled with a further material. The further material preferably has a higher refractive index than the material of the carrier and/or the microstructures.

The inventors have recognized that by using a conversion material within a diffractive optical element, a component can be produced that has a desired radiation characteristic.

In particular, the radiation characteristic can be adapted to customer requirements, for example. The conversion material can be introduced into the diffractive optical element and can thus replace the air surfaces with a refractive index n=1. As a result, the number of individual components in the component can be reduced.

The diffractive optical element and the conversion material preferably have a direct mechanical contact to each other. The component has a low component height and tailor-made radiation characteristics can be generated.

According to at least one embodiment, the component height is between 2 mm and 3 mm.

Alternatively or additionally, the diffractive optical element can hermetically encapsulate the conversion material against environmental influences, so that conversion materials sensitive to environmental influences can also be used.

Further embodiments provide a method of manufacturing an optoelectronic component. The method described here is preferably used to produce the optoelectronic component described here. The method comprises the method steps:

A) providing a light source configured to emit primary radiation,

B) producing a diffractive optical element which comprises at least one conversion material and is arranged in the radiation path of the primary radiation. For this purpose, two carriers are provided (step B1) and the microstructures are applied onto or produced on at least the first carrier (step B2). The conversion material is applied onto the second carrier (step B3).

Subsequently, in a further method step B4, the first and second carriers can be assembled so that the conversion material is encapsulated in the diffractive optical element, in particular hermetically sealed against environmental influences. The conversion material is arranged in the beam path of the primary radiation and is configured to convert the primary radiation at least partially or completely into secondary radiation.

BRIEF DESCRIPTION OF THE DRAWINGS

Further advantageous embodiments and developments are provided by the exemplary embodiments described below.

FIGS. 1 to 8 show schematic side views of an optoelectronic component according to one embodiment; and FIGS. 9A to 9G show a method for manufacturing a diffractive optical element according to one embodiment.

Figure 1:
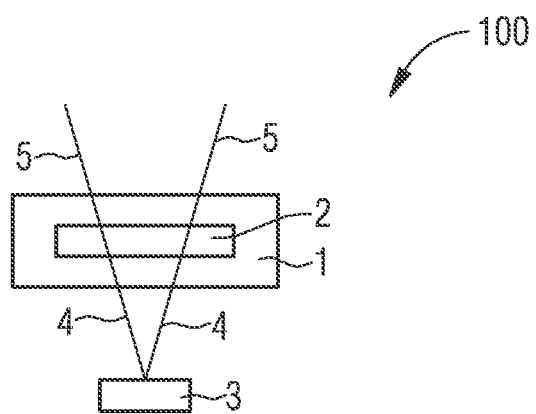

In the exemplary embodiments and figures, identical, similar and equivalent elements may each be provided with the same reference signs. The elements shown and their proportions are not to be regarded as true to scale. Rather, individual elements, such as layers, components, devices and areas, can be displayed in an exaggerated size for better representability and/or better understanding.

DETAILED DESCRIPTION OF ILLUSTRATIVE EMBODIMENTS

FIGS. 1 to 8 each show a schematic side view of an optoelectronic component 100 according to one embodiment.

The components of FIGS. 1 to 8 each comprise a light source 3. The light source 3, for example, is a pump light source, like a laser. The light source 3 is configured to emit primary radiation 4.

The emitted primary radiation 4 can be absorbed by a conversion material 2 and converted into a secondary radiation 5, which usually has a changed longer wavelength than the primary radiation 4.

The conversion material 2 is arranged in the beam path of the light source 3. The conversion material 2 is encapsulated in a diffractive optical element 1. The conversion material 2, for example, is an adamantane-like cluster molecule that at least partially absorbs primary radiation 4 and converts it into secondary radiation 5.

The diffractive optical element 1 is formed in particular as an encapsulation, for example, made of glass.

FIG. 1 shows that the diffractive optical element 1 comprises no microstructures 6. Here, the conversion material 2 is formed in particular as a layer with a layer thickness of, for example, 50 nm or 500 nm to 500 µm. In other words, the conversion material 2 is here surrounded frame-like by the diffractive optical element 1 as seen in the side cross section.

Figure 2:
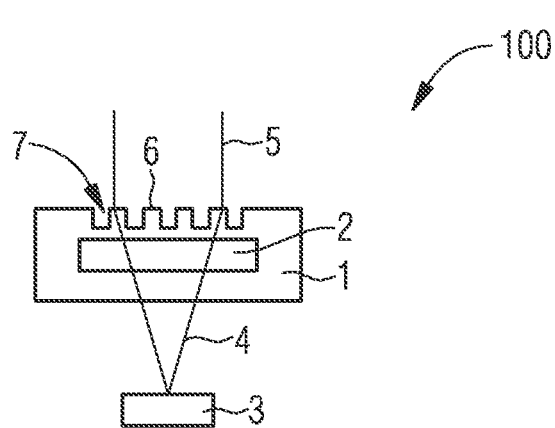

The component of FIG. 2 differs from the component of FIG. 1 in that it comprises microstructures 6 and recesses 7. Here, the microstructures 6 are arranged on the side of the diffractive optical element 1 opposite to the light source 3.

Figure 3:
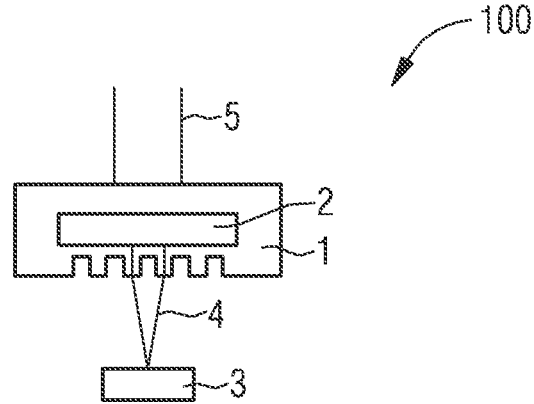

Alternatively, as shown in FIG. 3, microstructures 6 can also be arranged between conversion material 2 and light source 3. The microstructures have recesses 7. The recesses 7 can be filled with a further material 8 or air.

Figure 4:
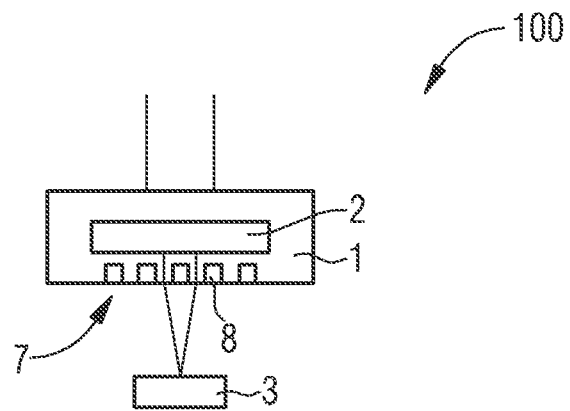

FIG. 4 shows that the recesses 7 can be filled with a further material 8. SiN, for example, can be used as a further material. The refractive index difference of the material of the diffractive optical element 1 and the further material 8 can be at least 0.4 (glass, e.g., n=1.5 and n(SiN)~2.0).

As a further material 8, for example, silicon nitride with a refractive index of about 2 can be used.

Figure 5:
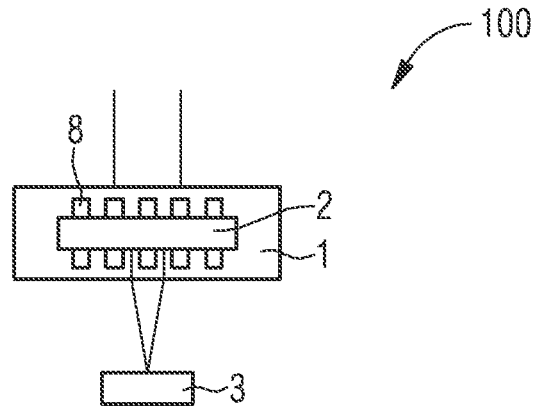

FIG. 5 shows a component 100 comprising microstructures 6 within the diffractive optical element 1. In particular, the microstructures 6 are arranged on both sides of the conversion layer 2. Microstructures 6 can be filled with a further material 8.

Figure 6:
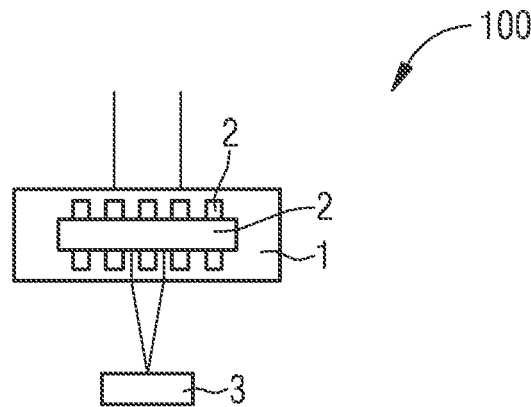

Alternatively, as shown in FIG. 6, the microstructures 6 are not filled with a further material 8, but with a conversion material 2. The conversion material 2 can be the same material as the conversion material 2 from which the conversion layer is formed. Alternatively, the conversion material 2 in the recesses 7 may also comprise another conversion material.

For example, the conversion material 2 with which the conversion layer is formed can emit red light and the conversion material arranged in the recesses 7 can emit green light. If blue light is now emitted from the light source 3, white mixed light can be decoupled from the component in the case of a partial conversion.

In particular, the conversion material 2 is not a Lambert radiator. The components described here can have a radiation characteristic of less than +/−30°, in particular +/−15°.

As shown in FIG. 7, the diffractive optical element 1 can also be formed as a multilevel DOE system. In FIG. 7, the DOE structure is filled with the conversion material. Condition is in particular that the glass (encapsulating material) has a different refractive index than the conversion material.

FIG. 8 shows a schematic side view of a component 100 according to one embodiment. Here the microstructures 6 are arranged between the light source 3 and the conversion material 2, which is formed as a conversion layer. Conversion material 2 can be shaped in the form of a ceramic or embedded in a matrix material. The primary radiation can have a radiation characteristic of +/−10°. The secondary radiation can have a radiation characteristic of +/−40°. Other wavelength and/or broadband with a radiation angle of 40°×60°, for example, are also possible for secondary radiation 5. The encapsulated conversion element 2 in the DOE is used for beam shaping of the primary radiation, e.g., 40°×60°. 40°×60° is the radiation characteristics after the conversion element, i.e., the so-called field-of-view. This means that the radiation characteristic changes to a rectangular field-of-view, for example, so that it is compatible with the field-of-view of a camera, for example.

FIGS. 9A to 9G show a method for manufacturing an optoelectronic component according to one embodiment.

Figure 9A:
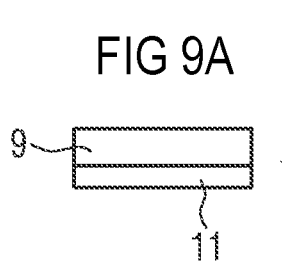

FIG. 9A shows providing a first carrier 9. A layer 11, for example, a dielectric, can be applied to this first carrier 9.

Figure 9B:
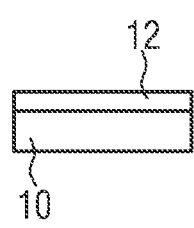

In FIG. 9B providing a second carrier 10 is shown, on which a layer 12, for example, a dielectric, can be applied.

Figure 9C:
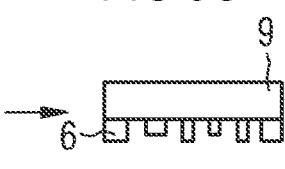
Figure 9D:
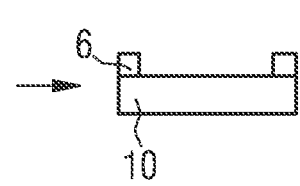
Figure 9E:
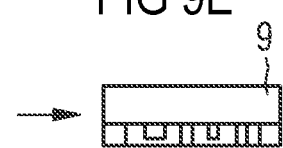
Figure 9G:
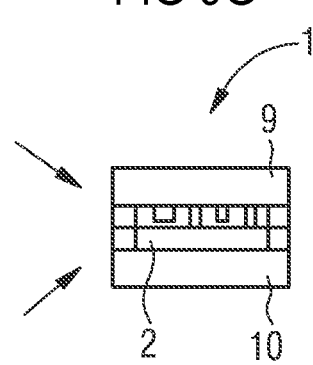

The dielectric layers 11, 12, which are arranged on the respective carrier 9, 10, can then be exposed to light and etched to thus produce a structure 6 in these dielectric layers (FIGS. 9C and 9D). Microstructures 6 can therefore be generated on the first and/or second carrier 9, 10.

The first and/or second carrier 9, 10 can be made of glass, for example. On the second carrier 10, the microstructure 6 can be shaped to form a frame and frame the conversion material 2 (FIG. 9D).

The microstructures 6 can then be planarized on the first carrier 9, as shown in 9E.

The microstructures 6, which are arranged on the second carrier 10, can be filled, for example, with a conversion material 2.

Both carriers, 9 and 10, can then be assembled to form a diffractive optoelectronic element 1 according to one embodiment.

The diffractive optical element 1 can then be arranged in the beam path of a light source 3 (not shown here). Thus, a component 100 can be provided that has a desired radiation characteristic.

The exemplary embodiments described in connection with the figures and their features can also be combined with each other according to further exemplary embodiments, even if such combinations are not explicitly shown in the figures. Furthermore, the exemplary embodiments described in connection with the figures may have additional or alternative features according to the description in the general part.

The invention is not limited to the exemplary embodiments by their description. Rather, the invention encompasses each feature as well as the combination of features, which in particular includes each combination of features in the patent claims, even if that feature or combination itself is not explicitly stated in the patent claims or exemplary embodiments.

The invention claimed is:

1. An optoelectronic component comprising:
a diffractive optical element comprising a first carrier, a second carrier, and at least one conversion material arranged as a conversion layer within the diffractive optical element;
a light source configured to emit primary radiation;
first microstructures arranged with the diffractive optical element on a side of the conversion layer facing away from the light source, wherein the first microstructures are arranged on the first carrier; and
second microstructures arranged within the diffractive optical element on a side of the conversion layer facing the light source, wherein the second microstructures are arranged on the second carrier,
wherein the conversion material is hermetically encapsulated in the diffractive optical element, and
wherein the conversion material is arranged in a beam path of the primary radiation and is configured to convert the primary radiation at least partially into secondary radiation.

2. The optoelectronic component according to claim 1, wherein the light source is a laser.

3. The optoelectronic component according to claim 1, wherein the light source is a VCSEL array configured to emit the primary radiation with a wavelength from an IR range.

4. The optoelectronic component according to claim 1, wherein a wavelength of the primary radiation is between 920 nm inclusive and 950 nm inclusive.

5. The optoelectronic component according to claim 1, wherein the conversion material is an adamantane-like cluster molecule.

6. The optoelectronic component according to claim 5, wherein the cluster molecule comprises tin.

7. The optoelectronic component according to claim 5, wherein the cluster molecule comprises tin and sulfur.

8. The optoelectronic component according to claim 1, wherein the conversion material is $[((4\text{-}(CH_2=CH)\text{-}C_6H_4)Sn)_4S_6]$.

9. The optoelectronic component according to claim 1, wherein a radiation angle of the primary radiation is between $<+/-30°$ and a radiation angle of the secondary radiation is $\geq$ than the radiation angle of the primary radiation.

10. The optoelectronic component according to claim 1, wherein the first microstructures are arranged directly on the side of the conversion layer facing away from the light source, and/or wherein second microstructures are arranged directly on the side of the conversion layer facing the light source.

11. The optoelectronic component according to claim 1, wherein the first microstructures comprise recesses filled with a further material, wherein the further material has a higher refractive index than a material of a carrier and/or the first microstructures.

12. A method for manufacturing an optoelectronic component, the method comprising:
providing a light source configured to emit primary radiation;
producing a diffractive optical element comprising at least one conversion material formed as a conversion layer and first and second microstructures; and
arranging the diffractive optical element in a beam path of the primary radiation,
wherein the first microstructures are arranged within the diffractive optical element on a side of the conversion layer facing away from the light source,
wherein the second microstructures are arranged within the diffractive optical element on a side of the conversion layer facing the light source,
and
wherein producing the diffractive optical element comprises:
providing two carriers;
applying or producing the first microstructures at least on a first carrier;
applying or producing the second microstructures at least on a second carrier;
applying the conversion material onto the second carrier; and
assembling the first and second carriers so that the conversion material is encapsulated in the diffractive optical element, wherein the conversion material is configured to convert the primary radiation at least partially into secondary radiation.

13. An optoelectronic component comprising:
a diffractive optical element comprising at least one first conversion material forming a conversion layer; and
a light source configured to emit primary radiation,
wherein the diffractive optical element comprises at least one carrier and first microstructures,
wherein the first microstructures comprise recesses filled with a second conversion material,
wherein the second conversion material is different from the first conversion material,
wherein the first conversion material is encapsulated in the diffractive optical element, and
wherein the first and second conversion materials are arranged in a beam path of the primary radiation and are configured to convert the primary radiation at least partially into secondary radiation.

14. The optoelectronic component according to claim 13, further comprising second microstructures arranged on a side of the diffractive optical element opposite to the light source.

* * * * *